United States Patent
Shirai et al.

(10) Patent No.: US 7,548,050 B2
(45) Date of Patent: *Jun. 16, 2009

(54) SWITCHING POWER SUPPLY DEVICE AND SEMICONDUCTOR INTEGRATED CIRCUIT

(75) Inventors: Nobuyuki Shirai, Tokyo (JP); Ryotaro Kudo, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/979,093

(22) Filed: Oct. 31, 2007

(65) Prior Publication Data

US 2008/0061756 A1 Mar. 13, 2008

Related U.S. Application Data

(63) Continuation of application No. 11/510,819, filed on Aug. 28, 2006, now Pat. No. 7,307,406.

(30) Foreign Application Priority Data

Aug. 29, 2005 (JP) ............................. 2005-248317

(51) Int. Cl.
*G05F 1/40* (2006.01)
(52) U.S. Cl. ..................... 323/285; 323/225; 323/283
(58) Field of Classification Search ................ 323/225, 323/282, 283, 284, 285, 290, 351
See application file for complete search history.

(56) References Cited

U.S. PATENT DOCUMENTS

| 6,381,160 | B1 | 4/2002 | Sauerlander et al. |
| 6,452,816 | B2 | 9/2002 | Kuranuki et al. |
| 6,492,794 | B2 | 12/2002 | Hwang |
| 6,671,143 | B2 * | 12/2003 | Hwang ........................ 323/278 |
| 6,737,842 | B2 | 5/2004 | Bai et al. |
| 7,307,406 | B2 * | 12/2007 | Shirai et al. .................. 323/285 |

FOREIGN PATENT DOCUMENTS

| JP | 2001-8444 | 1/2001 |
| JP | 2001-346380 | 12/2001 |

* cited by examiner

*Primary Examiner*—Jessica Han
(74) *Attorney, Agent, or Firm*—Mattingly & Malur, PC (57) ABSTRACT

A capacitor is disposed between the output side and the ground potential of an inductor which creates an output voltage. A first switch element supplies a current from an input voltage to an input side of the inductor, and a second switch element which is turned on when the first switch element is off sets the input side of the inductor to a prescribed potential. A control circuit detects the arrival of the voltage on the input side of the inductor at a high voltage corresponding to the input voltage when the load circuit is in a light load state and the second switch element is off, and turns on the first switch element. It invalidates the detection output of the voltage detecting circuit when the load circuit is in a heavy load state and, after the second switch element is turned off, turns on the first switch element.

18 Claims, 7 Drawing Sheets

SWITCHING POWER SUPPLY DEVICE AND SEMICONDUCTOR INTEGRATED CIRCUIT

CROSS-REFERENCE TO RELATED APPLICATION

This is a continuation application of U.S. Ser. No. 11/510,819, filed Aug. 28, 2006 now U.S. Pat. No. 7,307,406.

The present application claims priority from Japanese patent application No. 2005-248317 filed on Aug. 29, 2005 the content of which is hereby incorporated by reference into this application.

BACKGROUND OF THE INVENTION

The present invention relates to a switching power supply device and a semiconductor integrated circuit, more particularly to, for instance, a technique that can be effectively applied to a switching power supply device for converting a high voltage into a low voltage.

Examples of transformer type synchronous rectifying converter include what are disclosed in the Japanese Unexamined Patent Publications Nos. 2001-346380 and 2001-008444.

[Patent Reference 1] Japanese Unexamined Patent Publication No. 2001-346380

[Patent Reference 2] Japanese Unexamined Patent Publication No. 2001-008444

SUMMARY OF THE INVENTION

Figure 7:
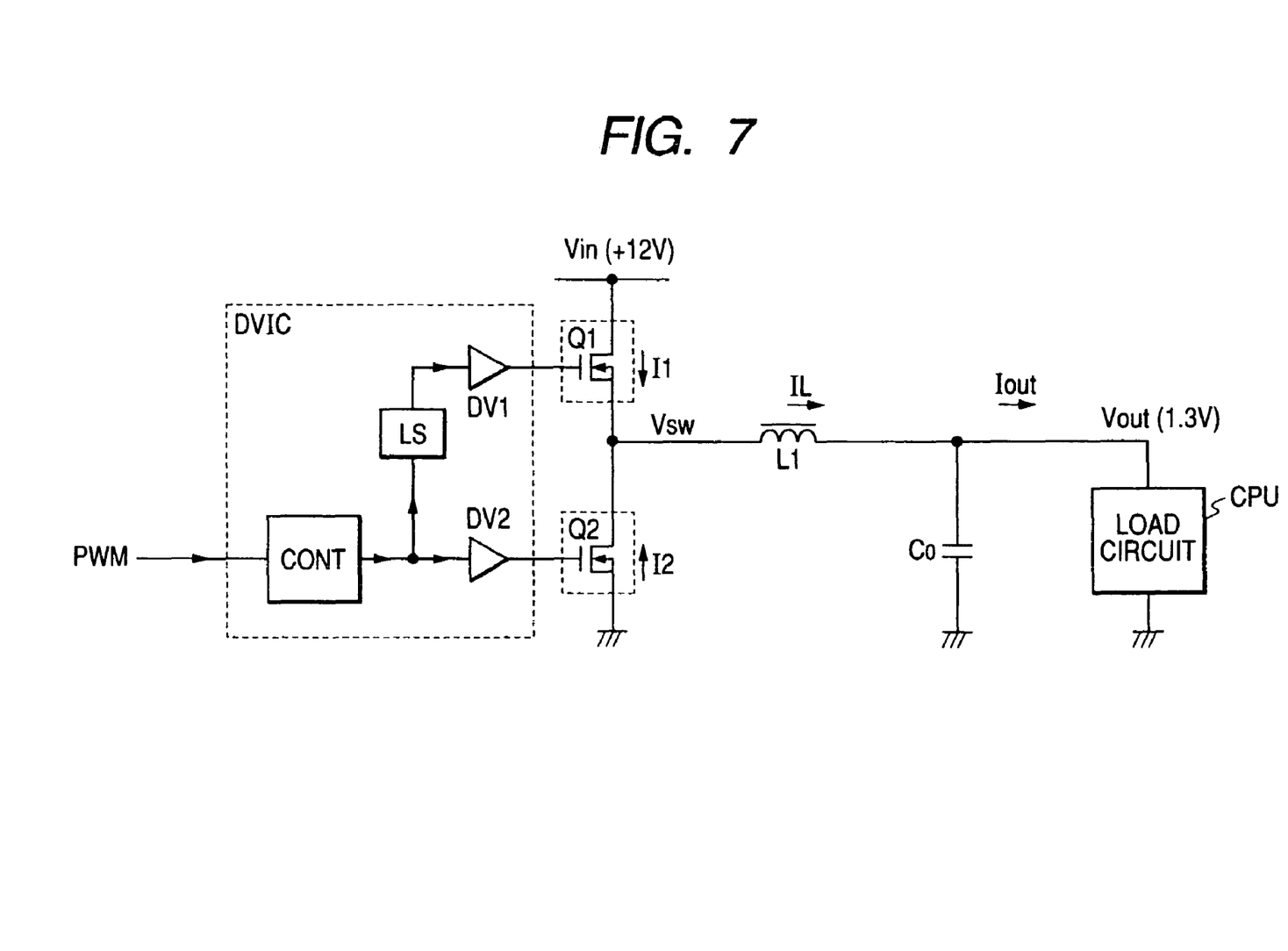
FIG. 7 is a block diagram of a step-down type switching power supply device studied prior to the invention of the present application.

Switching power supply devices are required to be inexpensive, compact and efficient, operate on a low voltage and provide a large current. For this reason, they often use as switch elements N-channel type power MOSFETS (hereinafter abbreviated to NMOSs), which are inexpensive, low in on-resistance (low Ron) and in the quantity of gate charge (low Qgd). FIG. 7 shows a block diagram of a voltage step-down type switching power supply device studied before the invention of the present application. The switching power supply device shown in FIG. 7 supplies a current to the input side of an inductor L1 via a high potential side switch MOSFET Q1 which is subjected to switch control with a pulse width modulation (PWM) signal and, provided with an output capacitor Co between the output side of the inductor L1 and the ground potential of the circuit, obtains an output voltage Vout. Between the inductor L1 and the ground potential, a low potential side switch MOSFET Q2 is provided. This MOSFET Q2 causes the input side of the inductor L1 when the MOSFET Q1 is turned off to be voltage-clamped to the ground potential of the circuit. The MOSFETs Q1 and Q2 are alternately, and their midpoint voltage Vsw manifests a waveform reciprocating between 0 V and an input voltage Vin. Stabilization of the output voltage Vout is achieved by adjusting the duty of PWM. More specifically, a PWM controller (not shown) is used to generate a PWM signal matching the output voltage Vout, and that signal is given to a driver DVIC.

Figure 8:
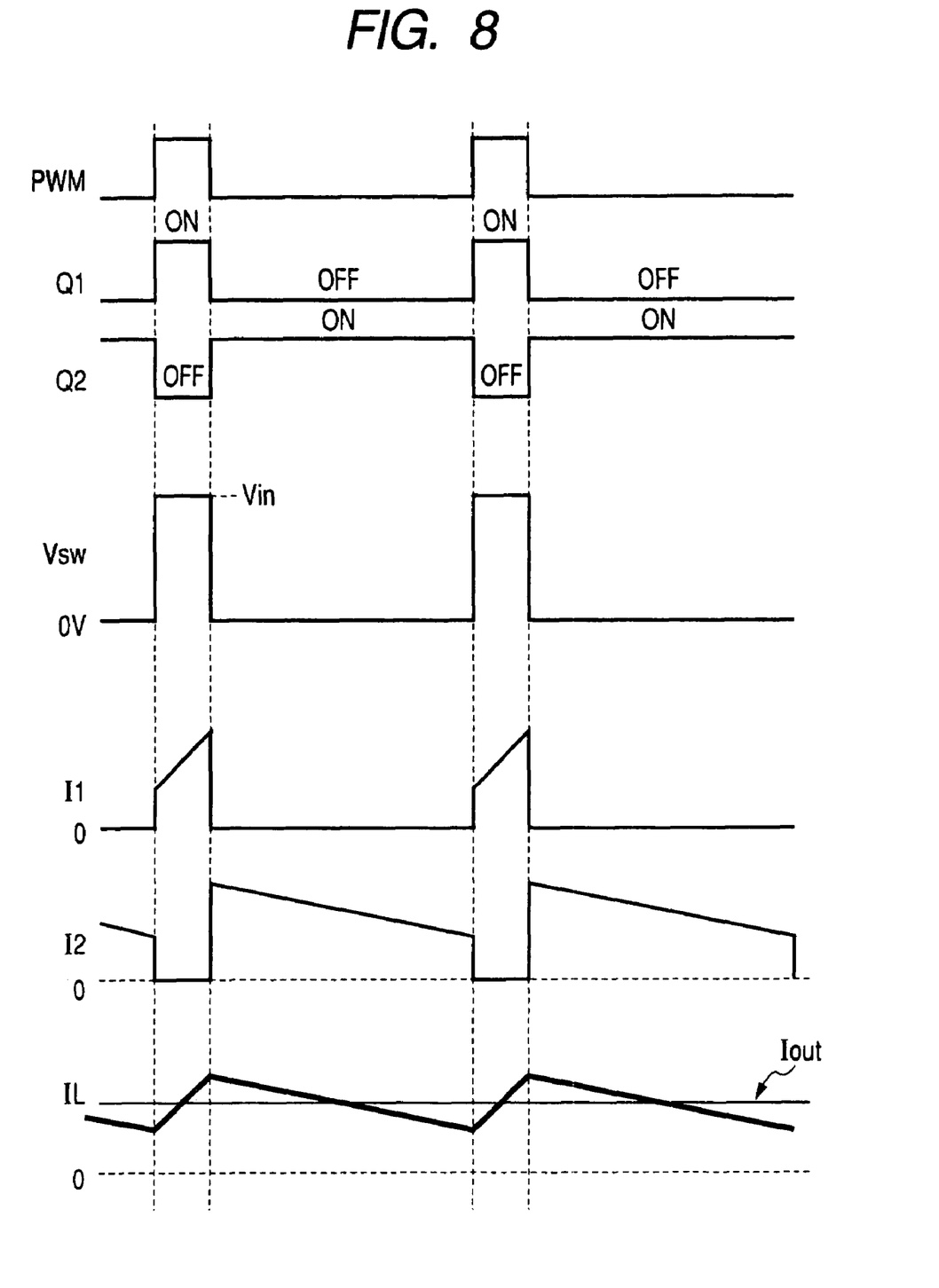
FIG. 8 shows switching waveforms in the switching power supply device of FIG. 7 when in the continuous current mode.
Figure 9:
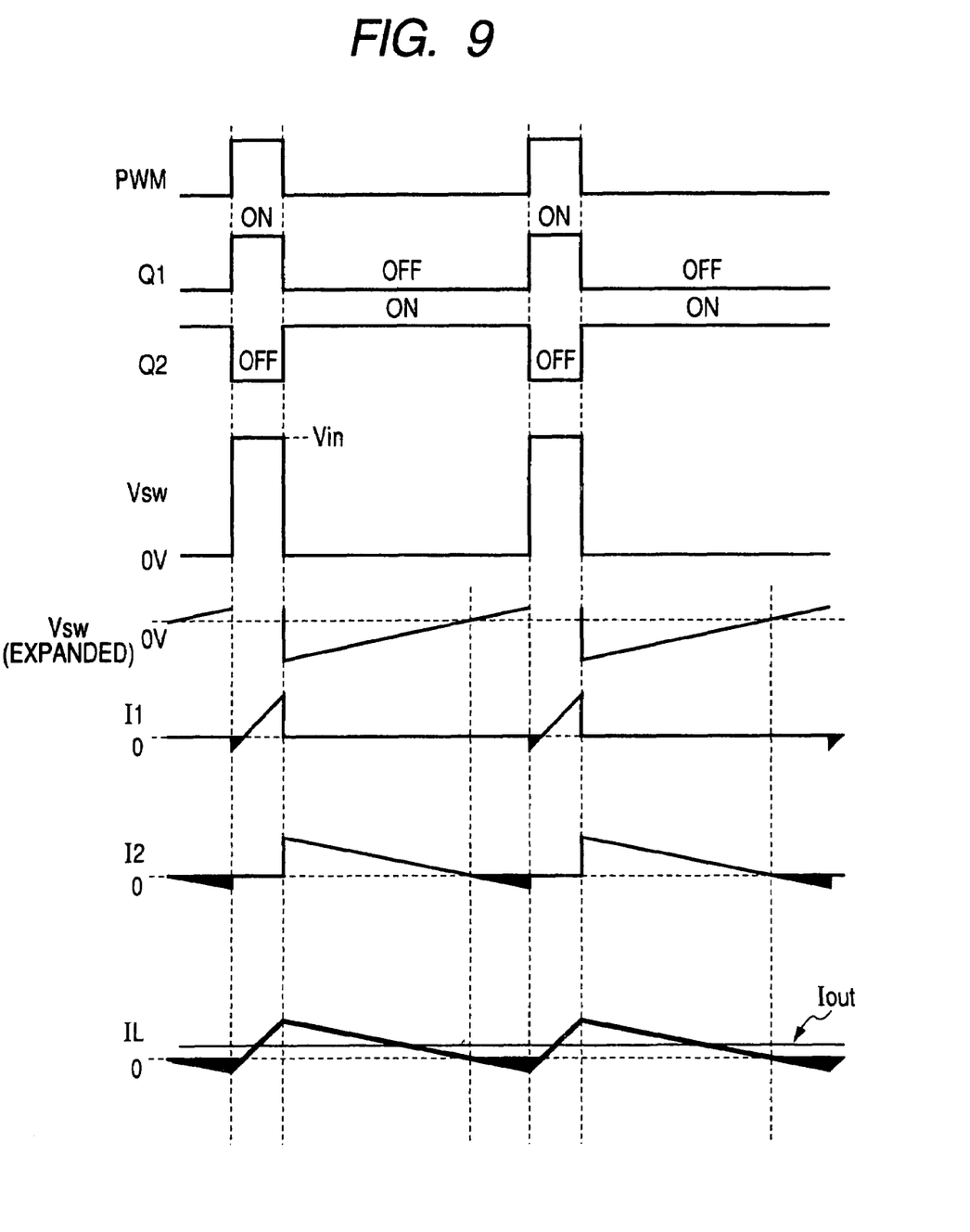
FIG. 9 shows switching waveforms in the switching power supply device of FIG. 7 when in the reverse current mode.

A continuous current mode (under heavy load) and a reverse current mode (under light load) in the voltage step-down type switching power supply device will be described. FIG. 8 shows the switching waveform in the continuous current mode and FIG. 9 shows the switching waveform in the reverse current mode. In the case of the continuous current mode shown in FIG. 8, a current IL flowing to the inductor (choke coil) L1 always constitutes a triangular wave of a positive value in at least one PWM cycle (a PWM signal is used in this case, though it need not be a PWM signal but any signal that controls the output voltage Vout by controlling the switching of power MOSFETs, such as a pulse frequency modulation (PFM) signal or a pulse density modulation (PDM) signal can be used), and its average is equal to the output current Iout. When the output current Iout becomes smaller, the current IL drops on the whole. And it is seen that there are periods of negative values (in the reverse direction to the current I2 in the same graph as indicated by solid black parts in FIG. 9. These are periods when a current is flowing in the reverse direction from the output capacitor Co to the MOSFET Q2 via the inductor L1.

From the turn-off of the high potential side MOSFET TQ1 until that of the low potential side MOSFET Q2 and from the turn-off of the MOSFET Q2 until that of the MOSFET Q1, periods in which both are turned off are set to prevent a through current from flowing by the simultaneous turning-on of both MOSFETs. Such a period is generally known as a dead time. Since both MOSFETs Q1 and Q2 are off during this dead time, the output current Iout during the period flows to the load side via the body diode (parasitic diode between the source and the substrate) of the MOSFET Q2. As the equivalent resistance of the body diode is higher than the on-resistance of the MOSFET Q2, usually the dead time is designed to be as short as practicable with a view to higher circuit efficiency, and its length is constant whether in the continuous current mode or in the reverse current mode. The inventors of the present application intend to improve efficiency by a contrivance oriented to this reverse current mode.

An object of the present invention is to provide a switching power supply device and a semiconductor integrated circuit realizing such efficiency improvement. This and other objects and novel features of the invention will become apparent from the description in this specification when taken in conjunction with the accompanying drawings.

A typical one of the aspects of the invention disclosed in this application will be briefly summarized below. A capacitor is disposed between the output side and the ground potential of an inductor which creates an output voltage. A first switch element supplies a current from an input voltage to the input side of the inductor, and a second switch element which comes on when the first switch element is off sets the input side of the inductor to a prescribed potential. A control circuit detects the arrival of the voltage on the input side of the inductor at a high voltage corresponding to the input voltage when a load circuit is in a light load state and the second switch element is turned off, and turns on the first switch element. When the load circuit is in a heavy load state, it invalidates the detection output of the voltage detecting circuit and, after the second switch element is turned off, turns on the first switch element.

The reverse current in a light load state can be utilized for charging the parasitic capacitance on the input side of the inductor, and the turn-on loss at the first switch element can be substantially reduced.

DESCRIPTION OF THE PREFERRED EMBODIMENTS

Figure 1:
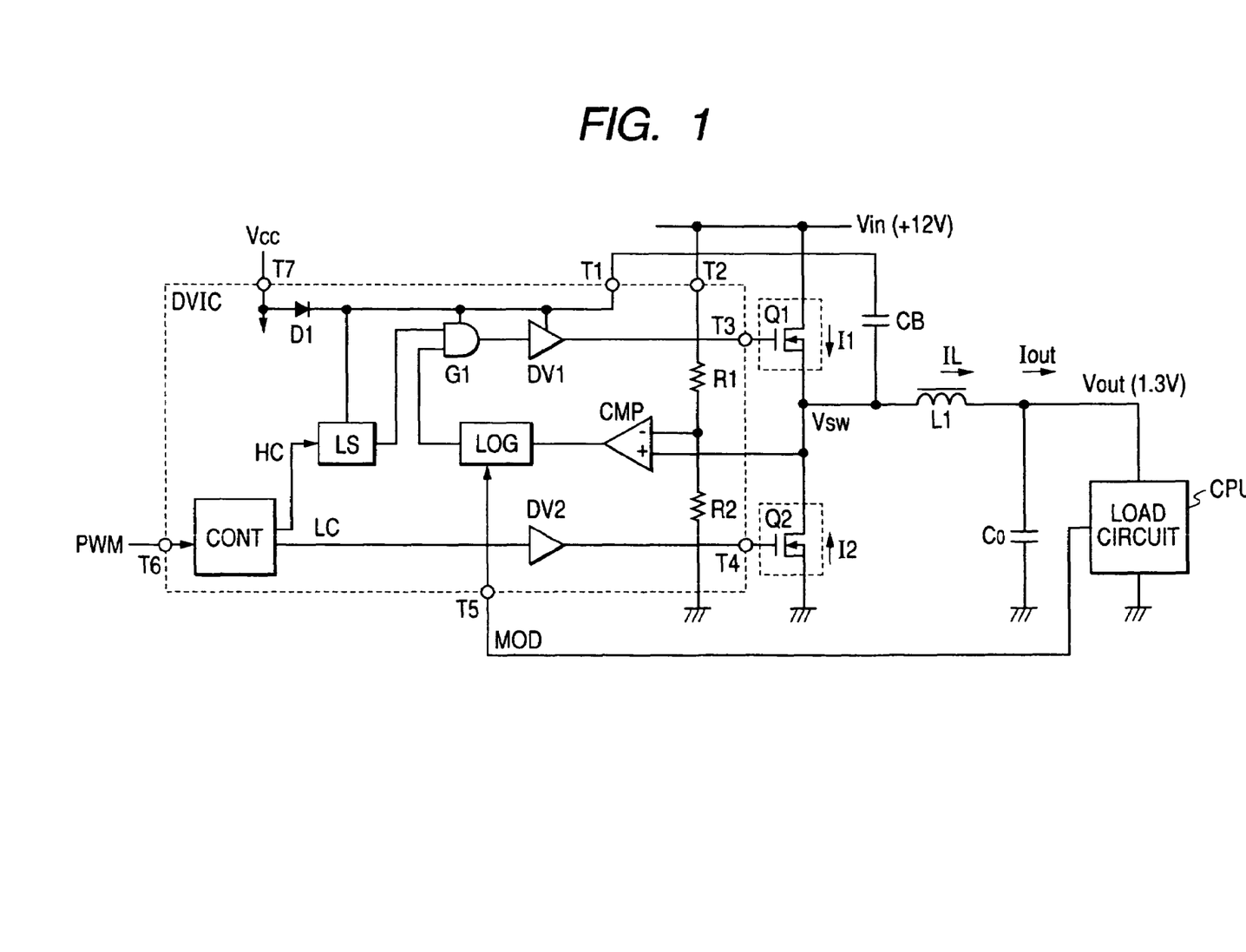
FIG. 1 is a schematic circuit diagram showing a switching power supply device, which is a preferred embodiment of the present invention.

FIG. 1 is a schematic circuit diagram showing a switching power supply device, which is a preferred embodiment of the present invention. This embodiment is intended for a so-called step-down type switching power supply device which forms an output voltage Vout, stepped down from an input voltage Vin. The input voltage Vin is supposed to be a relatively high voltage, such as about 12 V, and the output voltage Vout, a relatively low voltage, such as about 1.3 V, though not particularly limited to these voltages.

For the input voltage Vin, a current I1 is supplied from the input side of an inductor L1 via a high potential side switch MOSFET Q1. A capacitor Co is disposed between the output side of the inductor L1 and the ground potential GND and the circuit, and the output voltage Vout smoothed by this capacitor Co is formed. This output voltage Vout serves as the operational voltage for a load circuit, such as a microprocessor of a CPU. A switch MOSFET Q2 is provided between the input side of the inductor L1 and the ground potential GND of the circuit. This MOSFET Q2 comes on when the switch MOSFET Q1 is off, brings the midpoint voltage Vsw to the ground potential of the circuit and clamps the counter electromotive voltage generated in the inductor L1. The switch MOSFETs Q1 and Q2 are composed of N-channel type power MOSFETs. As stated above, the connection point of the switch MOSFETs Q1 and Q2 is connected to the input side of the inductor L1.

Though not illustrated in FIG. 1, a PWM signal which is formed by a PWM generating circuit and controls the output voltage Vout to about 1.3V is entered into an input control circuit CONT. The input control circuit CONT forms a high voltage signal HC and a low potential side signal LC matching the PWM signal. Dead times are set for the two signals HC and LC. The high potential side signal HC is conveyed to a gate circuit G1 through a level shift (level converting) circuit LS and to the gate of the high potential side switch MOSFET Q1 through a driver DV1. The low potential side signal LC is conveyed to the gate of the high potential side switch MOSFET Q2 through a driver DV2.

In this embodiment, a low Ron and low Qgd N-channel type power MOSFET Q1 is used as the high potential side switch element, which is operated as a source follower output circuit. For this reason, a booster circuit is provided to obtain a high enough voltage as the midpoint potential to match the input voltage Vin, or in other words to prevent the midpoint potential Vsw from falling as much as the threshold voltage of the MOSFET Q1 and there inviting a loss.

The booster circuit so operates as to boost the gate voltage to a level higher than the input voltage Vin by more than the threshold voltage of the MOSFET Q1 when it is on. Thus, the midpoint is connected to one end of a boot strap capacitance CB. The other end of this boot strap capacitance CB is connected to a power supply terminal Vcc via a diode D1. The power voltage supplied from the power supply terminal Vcc is a low voltage, such as about 5 V, and is used as the operational voltage for the input control circuit CONT, the low potential side circuit of the level shifter LS, the driver DV2 and a logic circuit LOG to be described afterwards. When the MOSFET Q1 is off and the MOSFET Q2 is on, the boot strap capacitance CB is charged up from the power supply terminal Vcc. When the MOSFET Q2 is turned off and the MOSFET Q1 is turned on, the gate voltage is boosted above the source side potential by the charged-up voltage for the boot strap capacitance CB.

This embodiment is provided with voltage dividing resistances R1 and R2 for dividing the input voltage. The resistance ratio between these voltage dividing resistances R1 and R2 is set to 1:4 or the like, though the ratio is not limited to this, and forms a divided voltage corresponding to 80% of the power voltage Vin. A voltage comparator circuit CMP compares the divided voltage and the midpoint voltage Vsw. When the midpoint voltage Vsw becomes higher than the divided voltage, the voltage comparator circuit CMP creates a detection signal and sends it to the logic circuit LOG. The logic circuit LOG, receiving a light load/heavy load mode signal MOD from a load circuit, controls the validity/invalidity of the detection signal of the voltage comparator circuit CMP, though its function is not limited to this. Thus, when the light load mode is indicated, the detection signal of the voltage comparator circuit CMP is validated. When the heavy load mode is indicated, the detection signal of the voltage comparator circuit CMP is invalidated.

In this embodiment, the input control circuit CONT, the level shift circuit LS, the gate circuit G1, the logic circuit LOG, the drivers DV1 and DV2, the voltage comparator circuit CMP and the voltage dividing resistances R1 and R2 are formed over a single semiconductor substrate to serve as a control circuit DVIC. Therefore, a terminal T1 to which the boot strap capacitance CB is connected, a terminal T2 to which the input voltage Vin is inputted, a terminal T3 to which the gate of the MOSFET Q1 is connected, a terminal T4 to which the gate of the MOSFET Q2 is connected, a terminal T5 to which the light load/heavy load mode signal MOD is inputted, a terminal T6 to which the PWM signal is inputted and a terminal T7 to which the power voltage Vcc is supplied are provided as external terminals.

Incidentally, a single semiconductor integrated circuit may as well be configured of the MOSFET Q1 formed over a first semiconductor substrate, the MOSFET Q2 formed over a second semiconductor substrate, the control circuit DVIC formed over a third semiconductor substrate, the control circuit DVIC, the MOSFET Q1 and the MOSFET Q2 being encapsulated in a single package. Alternatively, a single semiconductor integrated circuit may be configured of the control circuit DVIC and the MOSFET Q1 together formed over the first semiconductor substrate and the MOSFET Q2 formed over the second semiconductor substrate, the control circuit DVIC, the MOSFET Q1 and the MOSFET Q2 being encapsulated in a single package.

Figure 2:
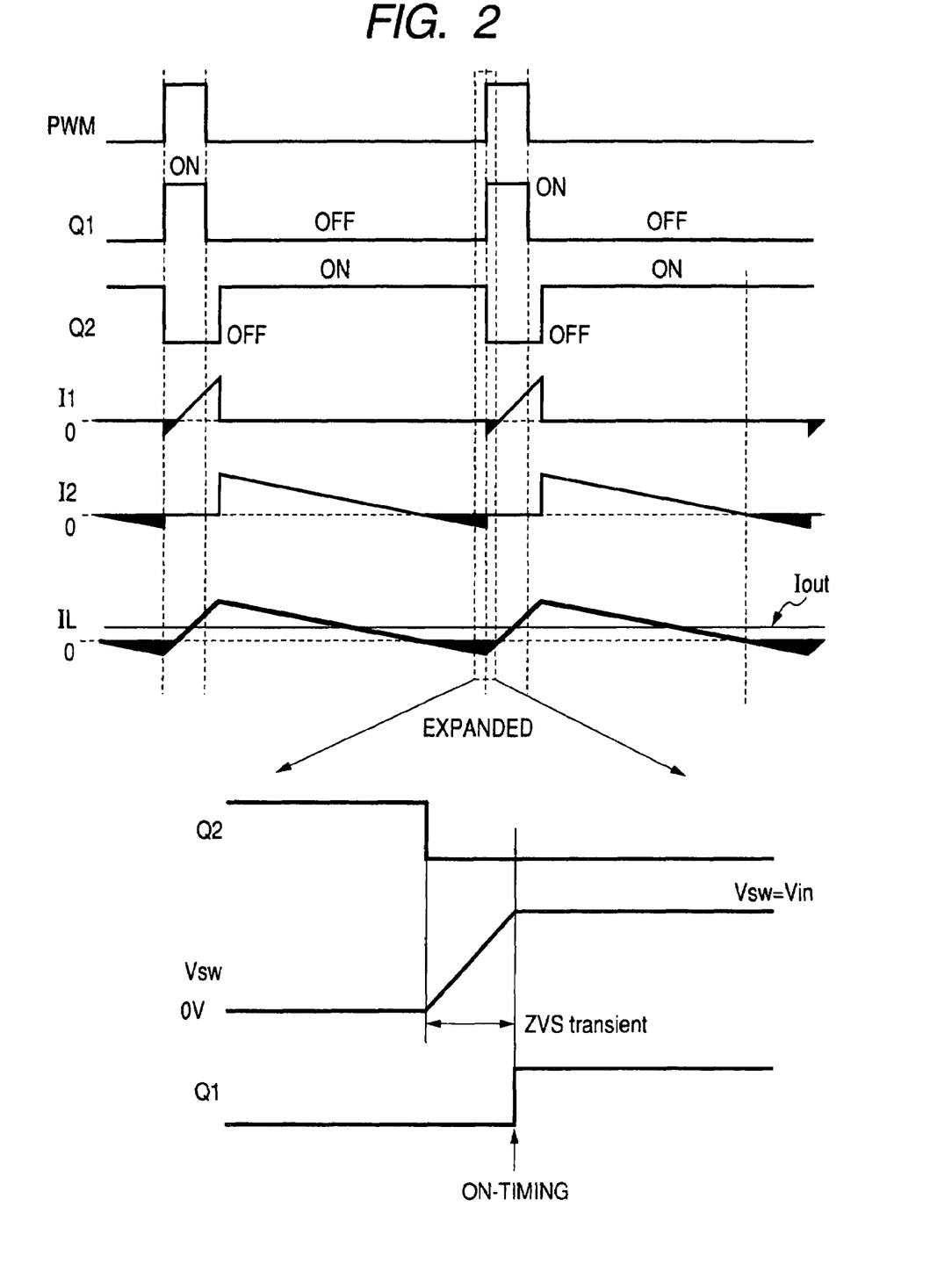
FIG. 2 shows switching waveforms in the switching power supply device of FIG. 1 when in the reverse current mode.

FIG. 2 shows switching waveforms when in the reverse current mode, in which in the switching power supply device according to the invention is under light load. The switching between the turning-off of the low potential side MOSFET Q2 and the turning-on of the high potential side MOSFET Q1 involve, as shown in the expanded part of FIG. 2, when the low potential side MOSFET Q2 is turned off, there are periods of negative values as indicated by solid black parts as in the foregoing. If the high potential side MOSFET Q1 is kept off then, the negative currents −I2 will enable the parasitic capacitance between the midpoint the ground potential of the circuit to be utilized for charging and thereby to let the midpoint potential Vsw rise.

In the embodiment of FIG. 1, as the arrival of this midpoint potential Vsw at about 80% of the input voltage is detected by the voltage comparator circuit CMP and the high potential side MOSFET Q1 is turned on through the logic circuit LOG-gate circuit G1 and the driver DV1, the MOSFET Q1 is turned on at a timing when the midpoint potential Vsw has become substantially equal to the input voltage Vin with the delay time on the signal path being taken into account. This makes it possible to reduce the power needed to let the midpoint voltage Vsw rise to the input voltage Vin to zero. In other words, the turn-on loss required to let the midpoint voltage Vsw from 0 V to the input voltage Vin when the MOSFET Q1 is turned on can be represented by Equation (1) below.

$$\text{Turn-on loss} = \tfrac{1}{2} \times Cx \times Vin^2 \times f$$

(where Cx is the parasitic capacitance between the midpoint and the ground potential GND of the circuit and f is the switching frequency)

As stated above, when in the reverse current mode, there are periods during which the current flows back from the output capacitor Co to the low potential side MOSFET Q2, and when the low potential side MOSFET Q2 is turned off, that current charges parasitic capacitance between the drain and source of the low potential side MOSFET (between the midpoint and the ground potential GND of the circuit). In this embodiment, the midpoint voltage Vsw after the low potential side MOSFET Q2 is turned of when in the reverse current mode is monitored by the voltage comparator circuit CMP, and when the midpoint voltage Vsw has substantially reached the input voltage Vin (for instance, a potential of 80% of Vi), the high potential side MOSFET Q1 is turned on.

Depending on the level of the reverse current, the midpoint voltage Vsw may not reach the input voltage Vin. In such a case, as the voltage comparator circuit CMP forms no detection signal, a maximum limit is imposed on the length of the dead time between the turning-off of the low potential side MOSFET Q2 until the turning-on off of the high potential side MOSFET Q1. In the embodiment of FIG. 1, the maximum dead time≦about 50 ns is provided in the logic circuit LOG (permissible time setting circuit), and after the lapse of this time the high potential side MOSFET Q1 is turned on by way of the gate circuit G1-driver DV1.

Figure 3:
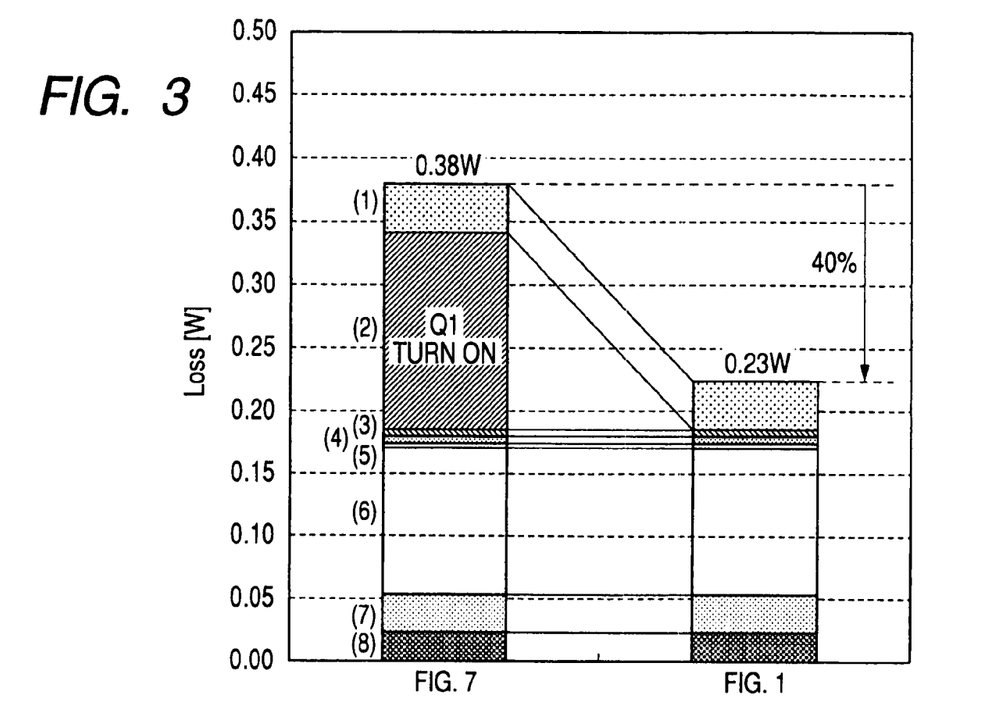
FIG. 3 illustrates loss analysis in switching power supply devices according to the related art and the present invention under light load.

FIG. 3 illustrates loss analysis in switching power supply devices according to the related art and the present invention under light load. The circuit conditions are supposed to be the input voltage Vin=12 V, the output voltage Vout=1.3 V, the output current Iout=1.0 A, the frequency f=500 KHz and the inductor L1=0.45 H. There are eight types of losses including (1) Q1 turn-off loss, (2) Q1 turn-on loss, (3) body diode loss, (4) Q2 conduction loss, (5) Q1 conduction loss, (6) 02 drive loss, (7) Q1 drive loss, (8) driver I C loss. Of these, (2) the Q1 turn-on loss is as stated above, and other losses can be represented as follows.

(1) Turn-off loss=$0.5 \times Vin \times (Iout+0.5 \times Ipp)^2 \times Ins/A \times f$ (3) Body diode loss=$TD/TS \times VF \times (Iout+0.5 \times Ipp)$ (where TD is the dead time, TS is the cycle and VF is the voltage of the body diode in the forward direction)

(4), (5) Conduction loss=$(Iout \times Duty \times \sqrt{(1+1/3 \ (0.5 \times Ipp/Iout))^2})^2 \times Ron$ (where Ipp is the ripple current of IL, and Ron is the on-resistance of MOSFET)

(6), (7) Drive loss=$Qg \times Vg \times f$ (where Qg is the gate charge of MOSFET and Vg is the gate drive voltage)

(8) Driver loss=$Icc \times Vcc$ (where Icc is the self-consumed current and Vcc is the power voltage)

According to the invention of the present application, (2) the Q1 turn-on loss, which accounts for about 40% of the total losses, can be eliminated.

Figure 4:
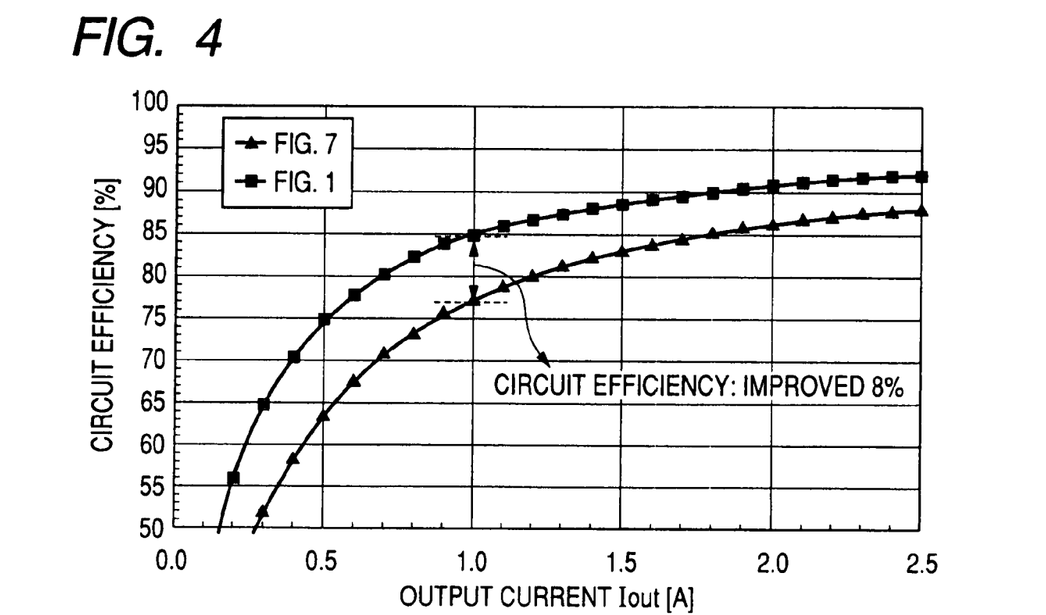
FIG. 4 illustrates circuit efficiency in the switching power supply devices according to the related art and the invention.

FIG. 4 illustrates circuit efficiency in the switching power supply devices according to the related art and the invention. This graph shows the circuit efficiency for the output current Iout. Since it is possible to eliminate the turn-on loss of Q1 under light load and set the dead time to the minimum under heavy load as stated above, the overall circuit efficiency can also be enhanced, by as much as approximately 8% when the output current Iout is 1 A. In other words, the output current Iout is small, efficiency can be enhanced by eliminating the aforementioned (2) turn-on loss of Q1.

Figure 5:
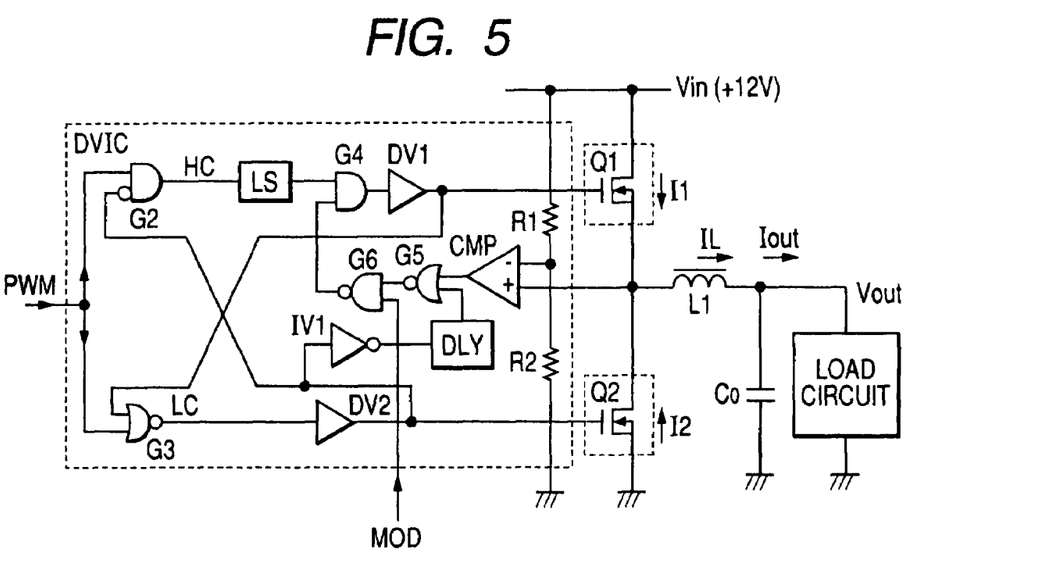
FIG. 5 is a circuit diagram showing a switching power supply device, which is another preferred embodiment of the invention.

FIG. 5 is a circuit diagram showing a switching power supply device, which is another preferred embodiment of the invention. In this embodiment, the input control circuit CONT and the logic circuit LOG of FIG. 1 above are shown more specifically. Herein, the booster circuit comprising the boot strap capacitance CB and other elements is not shown. The PWM signal is supplied to one input each of an AND gate circuit G2 and a NOR gate circuit G3. The output signal of the driver DV2 driving the low potential side MOSFET Q2 is inverted and inputted to the other input of the AND gate circuit G2. The output signal of the driver DV1 driving the high potential side MOSFET Q1 is inputted to the other input of the NOR gate circuit G3. The output signal HC of the AND gate circuit G2 is conveyed to the input of the driver DV1 through the level shift circuit LS and an AND gate circuit G4. Further, the output signal LC of the NOR gate circuit G3 is conveyed to the input of the driver DV2.

This basically causes the MOSFET Q1, when the PWM signal is at a high level, to be turned on when the output signal of the driver DV2 which turns off the MOSFET Q2 is at a low level and the MOSFET Q2, when the PWM signal is at a low level, to be turned on when the output signal of the driver DV1 which turns off the MOSFET Q1 is at a low level. In this way, the basic dead time is set to a short period of monitoring the levels of the drivers D1 and DV2.

In this embodiment, the detection signal of the voltage comparator circuit CMP is supplied to one input of a NOR gate circuit G5. The output signal of a delay circuit DLY which delays the output signal of an inverter circuit IV1 which inverts the output signal of the driver DV2 is supplied to the other input of the NOR gate circuit G5. The delay circuit DLY, constituting the permissible time setting circuit, limits the maximum dead time under light load. The output signal of the NOR gate circuit G5 is supplied to one input of a NAND gate circuit G6. A mode signal MOD which is raised to a high level (logic 1) when under the light load is supplied to the other input of the NAND gate circuit G6. The output signal of this NAND gate circuit G6 is used as a control signal for the AND gate circuit G4 which conveys the drive signal for the high potential side MOSFET Q1.

When the detection signal of the voltage comparator circuit CMP and the input signal from the delay circuit DLY are at a low level (logic 0), the NOR gate circuit G5 is outputting a high level (logic 1). Therefore, when the mode signal MOD is at a high level (logic 1), the NAND gate circuit G6 creates a low level output signal. Therefore, even when the PWM signal is at a high level and moreover the output signal of the driver DV2 which turns off the MOSFET Q2 is at a low level as described above, the turning-on of the MOSFET Q1 is stopped. When the detection signal of the voltage comparator circuit CMP varies to a high level, namely the midpoint voltage Vsw reaches about 80% or more of the input voltage Vin, the output signal of the NOR gate circuit G5 varies to a low level. Accordingly, as the NAND gate circuit G6 creates an output signal of a high level to open the gate of the AND gate circuit G4, the high potential side MOSFET Q1 is turned on through the driver DV1.

If the detection signal the voltage comparator circuit CMP remains at a low level even after the lapse of the delay time of the delay circuit DLY, namely if the reverse current is too small to charge the parasitic capacitance sufficiently, the output signal of the delay circuit DLY will vary to a high level and causes the output signal of the NOR gate circuit GS to vary to a low level as described above. Therefore, as the NAND gate circuit G6 creates an output signal of a high level to open the gate of the AND gate circuit G4, the high potential side MOSFET Q1 is turned on through the driver DV1.

When the load of the load circuit (CPU or the like) is heavy, the mode signal MOD is brought down to a low level (logic 0). This causes the NAND gate circuit G6 to output a high level irrespective of the output signals of the voltage comparator circuit CMP and the delay circuit DLY. Therefore, the high potential side MOSFET Q1 is cause to create a control signal HC which achieves turning-on at the timing of the low level of the output signal of the driver DV2 of the low potential side MOSFET Q2. This is intended to reduce losses in the body diode and thereby improve circuit efficiency under heavy load.

Figure 6:
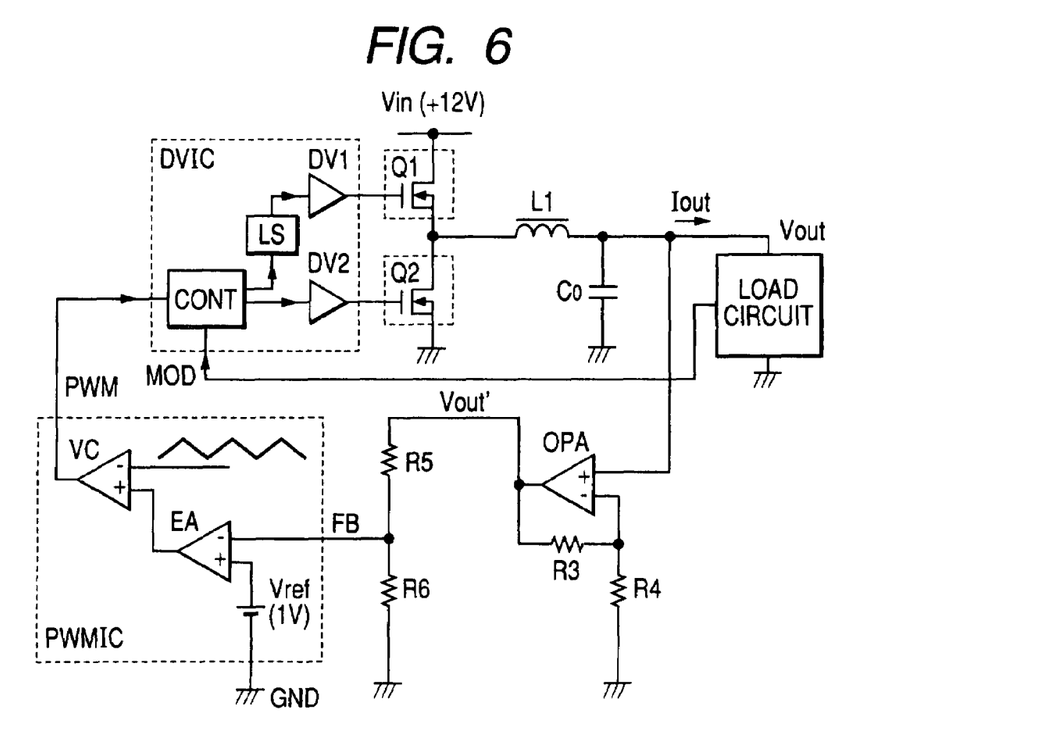
FIG. 6 is a schematic overall circuit diagram showing a switching power supply device, which is still another preferred embodiment of the invention.

FIG. 6 is a schematic overall circuit diagram showing a switching power supply device, which is still another preferred embodiment of the invention. For this embodiment, the input voltage Vin is supposed to be a relatively high voltage, such as about 12 V and the output voltage Vout, a relatively low voltage, such as about 0.8 V, though the choice is not particularly limited to these. This output voltage Vout is used as the operational voltage for load circuits such as FPGA and CPU.

This embodiment is composed of the control circuit DVIC mounted with the input control circuit CONT, the level shift circuit LS and the drivers DV1 and DV2, shown as a typical example in FIG. 1 and FIG. 5 above, together with a PWMIC for creating the PWM signal and unit components including the switch MOSFETs Q1 and Q2, the inductor L1, the output capacitor Co and so forth. In order to control the output voltage Vout to a relatively low voltage, such as about 0.8 V, though not particularly limited to this, there is provided a voltage amplifier circuit comprising an operational amplifier OPA and resistances R3 and R4. This voltage amplifier circuit constitutes a feedback control unit, which creates a voltage-amplified output voltage Vout', such as the output voltage Vout×(R3+R4)/R4. This voltage Vout' is divided by dividing resistances R5 and R6 in a ratio of R6/(R5+R6), and the divided voltage is conveyed to a feedback terminal FB of the PWM control circuit PWMIC.

The feedback voltage conveyed to the feedback terminal FB is supplied to one input (−) of an error amplifier EA of the PWMIC. A band gap reference voltage Vref of about 1 V, though not particularly limited to this level, is supplied to the other input (+) of the error amplifier EA. The differential voltage between the feedback voltage and the reference voltage Vref is supplied to one input (−) of a voltage comparator circuit VC. A triangular wave created by a triangular wave generating circuit is supplied to the other input (+) of the voltage comparator circuit VC. The output signal of the voltage comparator circuit VC is inputted as a PWM signal to the input control circuit CONT provided in the driver DVIC. It is not particularly limited to a PWM signal, but what controls the output voltage Vout by regulating the switching of power MOSFETs, such as a pulse frequency modulation (PFM) signal or a pulse density modulation (PDM) signal, can be used as well.

Where a higher voltage than the band gap reference voltage Vref of about 1 V or so, such as 1.3 V, provided in the PWMIC is to be formed, as the output voltage Vout, the aforementioned voltage amplifier circuit comprising an operational amplifier OPA and resistances R3 and R4 can be dispensed with. By selectively disposing such voltage amplifier circuit comprising an operational amplifier OPA and resistances R3 and R4, the output voltage Vout can be set in a broad range with the combination of circuits comprising DVIC, PWMIC and external components.

Although the invention accomplished by the present inventors have been hitherto described in specific terms with reference to preferred embodiments thereof, the invention is not limited to these embodiments, but can be modified in various manners without deviating from its essentials. For instance, the logic circuit LOG to validate/invalidate the detection signal of the voltage comparator circuit CMP can be realized in one or another of a number of specific configurations. Or, the mode signal MOD may be one using a signal such as a sleep mode or a standby mode of the load circuit CPU, or alternatively the switching power supply device itself may be provided with a circuit for detecting a light load state. This invention can be expensively used for voltage step-down type switching power supply devices.

What is claimed is:

1. In a switching power supply device, comprising:
    an inductor,
    a capacitor disposed between an output side and a ground potential of said inductor,
    a first switch element for supplying a current from an input voltage to an input side of said inductor,
    a second switch element which comes on when said first switch element is off to set the input side of said inductor to a prescribed potential, and
    a control circuit which creates a first control signal to be supplied to said first and second switch elements so as to set the output voltage obtained from the output side of said inductor to a desired level,
    a method performed by the control circuit comprising the steps of:
    creating, by a voltage detecting circuit, a detection signal by which the arrival of the voltage on said input side of said inductor at a first voltage corresponding to said input voltage is detected,
    validating the operation of said voltage detecting circuit when a load circuit supplied with said output voltage is in a light load state, and generating a second control signal which, when said second switch element is turned off, turns on the first switch element with the detection signal of said voltage detecting circuit, and
    invalidating the detection signal of said voltage detecting circuit when said load circuit is in a heavy load state and, after said second switch element is turned off, turning on said first switch element.

2. The method according to claim 1, wherein said control circuit comprises a permissible time setting circuit for use in said light load state and generates a second control signal which, if the detection signal of said voltage detecting circuit is not created within a set period of said permissible time setting circuit, turns on said first switch element after the lapse of such set period.

3. The method according to claim 2, wherein the light load state of said load circuit corresponds to a state when an operating mode of said load circuit is a standby or sleep mode.

4. The method according to claim 3,
wherein said control circuit comprises a voltage dividing circuit for creating a divided voltage corresponding to approximately 80% of said input voltage, and
wherein said voltage detecting circuit performs said step of creating a detection signal with said divided voltage as a reference voltage.

5. The method according to claim 4,
wherein said first switch element and second switch element are N-channel MOSFETs, the switching power supply device further comprises:
a booster circuit including a boot strap capacitance of which one end is connected to the source of the N-channel MOSFET constituting said first switch element, and
a level shift circuit for creating a drive signal matching the boosted voltage created by said booster circuit, the level shift circuit being provided at a gate of the N-channel MOSFET constituting said first switch element.

6. The method according to claim 5,
wherein the control circuit including said voltage detecting circuit and voltage dividing circuit is formed within a single semiconductor integrated circuit, and
wherein said first and second switch elements, inductor, capacitor and boot strap capacitance constituting the booster circuit are composed of externally attached components.

7. The method according to claim 6 further comprising a PWM signal generating circuit for generating a PWM signal which makes the divided voltage of said output voltage coincident with a prescribed reference voltage,
wherein said PWM signal is inputted to said control circuit to set an on-period of said first switch element.

8. In a switching power supply device comprising:
an inductor,
a capacitor disposed between an output side and an ground potential of said inductor,
a first switch element for supplying a current from an input voltage to an input side of said inductor,
a second switch element which comes on when said first switch element is off to set the input side of said inductor to a prescribed potential, and
a control circuit which creates a first control signal to be supplied to said first and second switch elements so as to set the output voltage obtained from the output side of said inductor to a desired level,
a method performed by said control circuit comprising the steps of:
creating, by avoltage detecting circuit, a detection signal by which the arrival of the voltage on said input side of said inductor at a first voltage corresponding to said input voltage is detected,
validating the operation of said voltage detecting circuit in a first state having a period in which a current flows from a load circuit to which said output voltage is supplied to a second switch element in at least one PWM cycle, and generating a second control signal which turns on said first switch element with the detection signal of said voltage detecting circuit when said second switch element is turned off, and
invalidating the detection signal of said voltage detecting circuit in a second state in which a current continuously flows from said switching power supply device to said load circuit in at least one said PWM cycle and, after said second switch element is turned off, turns on said first switch element.

9. The method according to claim 8, wherein said control circuit comprises a permissible time setting circuit for use in said first state and generates a second control signal which, if the detection signal of said voltage detecting circuit is not created within a set period of said permissible time setting circuit, turns on said first switch element after the lapse of such set period.

10. The method according to claim 9, wherein the first state of said load circuit corresponds to a state when an operating mode of said load circuit is a standby or sleep mode.

11. The method according to claim 10,
wherein said control circuit comprises a voltage dividing circuit for creating a divided voltage corresponding to approximately 80% of said input voltage, and
wherein said voltage detecting circuit performs said step of creating a detecting signal with said divided voltage as a reference voltage.

12. The method according to claim 11,
wherein said first switch element and second switch element are N-channel MOSFETs, and the switching power supply device further comprises:
a booster circuit including a boot strap capacitance of which one end is connected to the source of the N-channel MOSFET constituting said first switch element, and
a level shift circuit for creating a drive signal matching the boosted voltage created by said booster circuit, the level shift circuit being provided at a gate of the N-channel MOSFET constituting said first switch element.

13. In a semiconductor integrated circuit comprising:
a first switch element which supplies a current from an input voltage to a load circuit,
a second switch element which comes on when said first switch element is off and supplies a current to said load circuit, and
a control circuit which creates a first control signal to be supplied to said first and second switch elements so as to set the voltage obtained to be supplied to said load circuit to a desired level,
a method performed by said control circuit comprising:
creating, by a voltage detecting circuit, a detection signal by which the arrival of the voltage on the input side of an inductor at a first voltage corresponding to said input voltage is detected,
validating the operation of said voltage detecting circuit when said load circuit supplied with said output voltage is in a light load state, and generating a second control signal which, when said second switch element is turned off, turns on the first switch element with the detection signal of said voltage detecting circuit, and
invalidating the detection signal of said voltage detecting circuit when said load circuit is in a heavy load state and, after said second switch element is turned off, turns on said first switch element.

14. The method according to claim 13, wherein the light load state of said load circuit corresponds to a state when an operating mode of said load circuit is a standby or sleep mode.

15. The method according to claim 14,
wherein said control circuit comprises a voltage dividing circuit for creating a divided voltage corresponding to approximately 80% of said input voltage, and
wherein said voltage detecting circuit performs said step of creating a detection signal with said divided voltage as a reference voltage.

16. The method according to claim 15,
wherein said first switch element and second switch element are N-channel MOSFETs, the switching power supply device further comprises:

a booster circuit including a boot strap capacitance of which one end is connected to the source of the N-channel MOSFET constituting said first switch element, and a level shift circuit for creating a drive signal matching the boosted voltage created by said booster circuit the level shift circuit being provided at a gate of the N-channel MOSFET constituting said first switch element.

17. The method according to claim 13, wherein said first switch element is formed over a first semiconductor substrate, wherein said second switch element is formed over a second semiconductor substrate, wherein said control circuit is formed over a third semiconductor substrate, and wherein said first, second and third semiconductor substrates are encapsulated in a single package.

18. The method according to claim 13, wherein said first switch element and said control circuit are formed over the first semiconductor substrate, wherein said second switch element is formed over the second semiconductor substrate, and wherein said first and second semiconductor substrates are encapsulated in a single package.

* * * * *